United States Patent [19]

Andresen et al.

[11] Patent Number: 5,355,037
[45] Date of Patent: Oct. 11, 1994

[54] HIGH PERFORMANCE DIGITAL PHASE LOCKED LOOP

[75] Inventors: Bernhard H. Andresen, Dallas; Joseph A. Casasanta, Allen; Stanley C. Keeney; Robert C. Martin, both of Dallas; Yoshinori Satoh, Plano, all of Tex.

[73] Assignee: Texas Instruments Incorporated, Dallas, Tex.

[21] Appl. No.: 898,981

[22] Filed: Jun. 15, 1992

[51] Int. Cl.$^5$ ............................................. H03K 17/28
[52] U.S. Cl. ................................. 307/602; 307/511; 307/262; 328/133; 328/155; 377/76
[58] Field of Search ................ 307/525, 526, 527, 511, 307/269, 597, 296.2; 328/55, 133, 134; 377/76

[56] References Cited

U.S. PATENT DOCUMENTS

| | | | |
|---|---|---|---|
| 3,641,370 | 2/1972 | Heimbigner | 307/269 |
| 4,656,369 | 4/1987 | Lou | 307/296.2 |
| 4,751,469 | 6/1988 | Nakagawa et al. | 328/133 |
| 4,795,964 | 1/1989 | Mahant-Shetti et al. | 324/60 |
| 5,227,675 | 7/1993 | Taguchi | 307/296.2 |

OTHER PUBLICATIONS

"A Fully Digital Phase Locked Loop", Victor Menasce et al., Canadian Conference on Very Large Scale Integration, Oct. 1990, pp. 9.4/1–9.4/8.

"ASIC Clock Distribution Using A Phase Locked Loop (PLL)", Laurin Ashby, Conference Proceedings from 1991 IEEE ASIC Seminar and Exhibit, 1991, pp. P1-6.1–P1-6.3.

Primary Examiner—Timothy P. Callahan
Assistant Examiner—My-Trang Ton
Attorney, Agent, or Firm—Robby T. Holland; Scott B. Stahl; Richard L. Donaldson

[57] ABSTRACT

A first periodic digital waveform is to be synchronized with a second periodic digital waveform obtained by propagating the first waveform through a delay path (13) having an adjustable propagation delay. In the disclosed approach, the delay of the delay path is increased, even when an edge (43) of the second waveform trails a corresponding edge (45) of the first waveform by less than one-half cycle. The delay continues to be increased until the edge of the second waveform is eventually time-shifted past the next successive corresponding edge (49) of the first waveform.

11 Claims, 5 Drawing Sheets

HIGH PERFORMANCE DIGITAL PHASE LOCKED LOOP

FIELD OF THE INVENTION

This invention relates generally to phase locked loops and, more particularly, to a high performance digital phase locked loop for use in high frequency clock synchronization applications.

BACKGROUND OF THE INVENTION

Clock frequency requirements of electronics systems are continually increasing. Thus, system designers must address increasingly complex clock synchronization requirements. For example, in a system which uses application specific integrated circuits (ASICs), it is important to minimize on-chip clock distribution delay and total system clock skew in order to provide for safe data transfer between the ASICs. The need for effective high frequency clock synchronization is therefore apparent.

Some conventional approaches to the problem of clock skew minimization provide a digital phase locked loop (PLL) for each IC in the system. Each PLL attempts to eliminate the effects of the on-chip clock distribution delay of the associated IC. Each PLL typically includes a phase detector and a digital delay line, each of which has the system clock as an input. The digital delay line is arranged as a component of the on-chip clock distribution path. The on-chip clock, obtained at the downstream end of the on-chip clock distribution path, is fed back as an input to the phase detector. The phase detector, typically a D flip-flop, detects information about the phase relationship between the system clock and the on-chip clock, and provides this information to the digital delay line. The digital delay line adjusts the delay of the on-chip clock distribution path based on the phase information provided by the phase detector. This feedback adjustment of the on-chip clock distribution path delay is continued until the on-chip clock and the system clock are acceptably synchronized.

Some conventional PLLs remove delay from the clock distribution path whenever the on-chip clock trails the system clock by less than one-half cycle, and add delay to the path whenever the on-chip clock trails the system clock by more than one-half cycle. However, upon initial start up, the delay path is typically at its minimum delay, and this minimum delay is often less than one-half cycle. Thus, the PLL will attempt to remove delay from the path, but the delay cannot decrease below its minimum value. As a result, the clocks cannot be synchronized.

Some conventional PLLs add delay even when the on-chip clock trails the system clock by less than one-half cycle. However, the conventional D flip-flop phase detector is not edge sensitive to rising edges only. Therefore, before the rising edge of the on-chip clock is delayed enough to reach the next rising edge of the system clock, it reaches the intervening falling edge of the system clock and is locked with this falling edge. Thus, the PLL will lock on either a falling edge or a rising edge of the system clock. This means that, for any given minimum delay time of the on-chip clock distribution path, the permissible frequency and duty cycle of the system clock are disadvantageously limited.

In order to avoid the aforementioned problems which can occur when the on-chip clock trails the system clock by less than one-half cycle, some systems have an external delay element provided in the system clock path upstream of the phase detector. The external delay element changes the phase relationship so that, at the phase detector input, the on-chip clock effectively trails the system clock by more than one-half cycle. That is, the external delay element forces the two clocks into a phase relationship which is more conducive to the PLL's synchronization capability. However, this solution disadvantageously introduces additional costs and design complexity.

Another problem with conventional PLLs is undesirably high phase jitter. Phase jitter is a function of the phase resolution of the phase detector and the step size of the digital delay line. Some conventional D flip-flop phase detectors have a phase resolution of about 400 ps. This alone can make the overall PLL phase jitter 500 ps or more.

In addition to the aforementioned phase detector problems, conventional PLLs are often operationally limited to a single frequency or a very narrow frequency range due to the structure of the digital delay line. One conventional delay line includes a plurality of serially connected delay elements, and a shift register which switches the delay elements to a longer or shorter delay to achieve lock. The clock signal propagates through each delay element. Another conventional delay line includes a plurality of serially connected delay elements, and a plurality of switches which couple the respective delay element outputs to the overall output of the delay line. By appropriate operation of the switches, a desired number of the delay elements can be selectively switched into or out of the clock path. Both of the aforementioned delay line structures limit the frequency range of the PLL. In addition, these approaches can introduce undesirable loading conditions which adversely affect the clock waveform.

In view of the foregoing discussion, it is desirable to provide a high performance digital PLL which overcomes the aforementioned problems associated with conventional PLLs.

SUMMARY OF THE INVENTION

According to the present invention, a first periodic digital waveform is to be synchronized with a second periodic digital waveform obtained by propagating the first waveform through a delay path having an adjustable propagation delay. To achieve synchronization, the delay of the delay path is increased, even when an edge of the second waveform trails a corresponding edge of the first waveform by less than one-half cycle. The delay continues to be increased until the edge of the second waveform is eventually time-shifted past the next successive corresponding edge of the first waveform.

BRIEF DESCRIPTION OF THE DRAWINGS

Exemplary embodiments of the invention are described below in conjunction with the appended drawings, in which.

DETAILED DESCRIPTION

Figure 1:
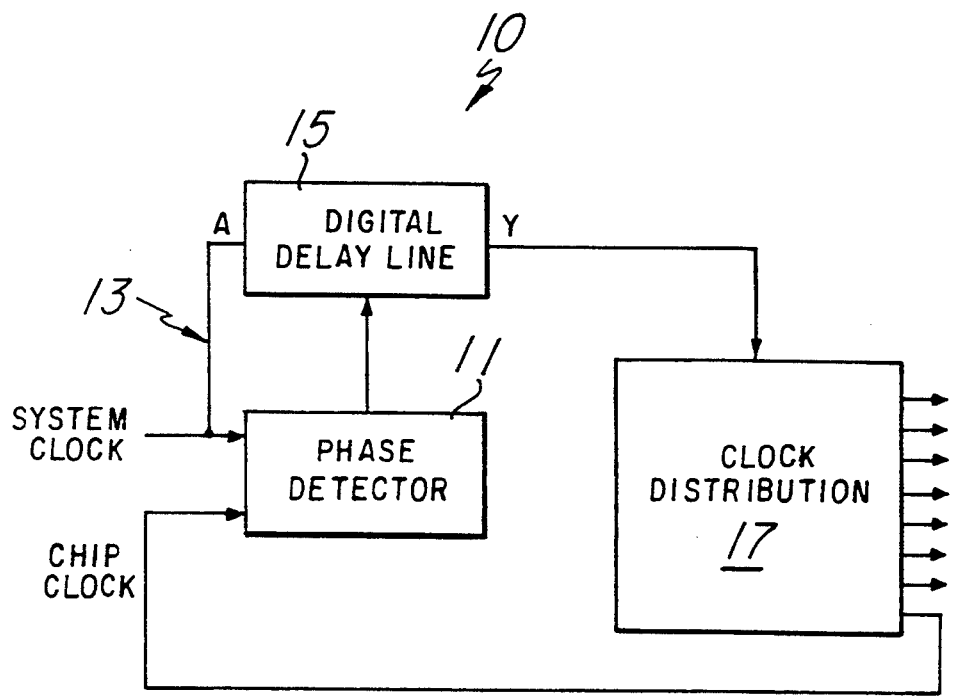
FIG. 1 is a block diagram showing a digital PLL circuit according to the present invention.

FIG. 1 illustrates a PLL circuit 10 which synchronizes a system clock signal with a chip clock signal of an individual integrated circuit. An electronic system typically includes a plurality of integrated circuits, each of which has a similar PLL circuit so that all of the respective chip clocks can be synchronized with the system clock. The system clock is input to a phase detector 11 and a delay path 13. The delay path 13 includes a digital delay line 15 and other delaying elements such as a high fanout clock distribution circuit 17. The clock distribution circuit 17 distributes the chip clock throughout the integrated circuit, and also feeds back the chip clock as an input to the phase detector 11. Because the system clock is provided at the input of delay path 13 and the chip clock is obtained at the output of delay path 13, the chip clock is time-shifted relative to the system clock due to the delay of the delay path 13.

The phase detector 11 detects the phase relationship between the system clock and the chip clock, and includes a control circuit which produces control signals based on the detected phase relationship. The control signals from the control circuit are then applied to the digital delay line 15, which is responsive to the control signals to adjust the amount of delay in the delay path 13.

Figure 2:
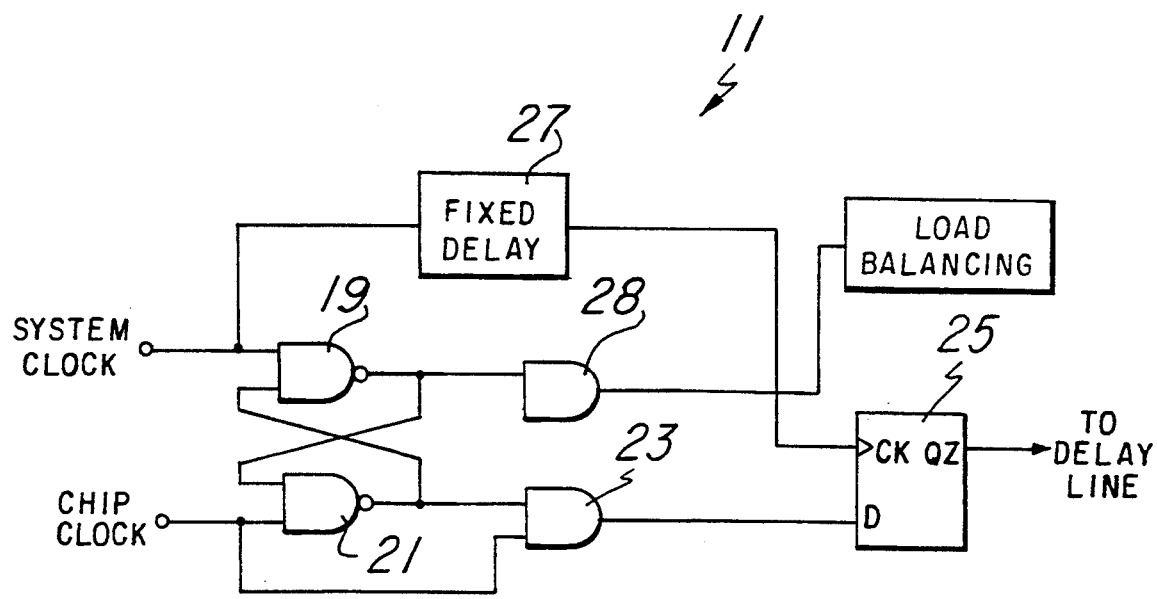
FIG. 2 is a circuit diagram of one embodiment of the phase detector of FIG. 1.

The control circuit of phase detector 11 is illustrated in detail in FIG. 2. More specifically, the phase detector 11 includes a pair of cross-coupled NAND gates 19 and 21, the NAND gate 19 having the system clock input thereto and the NAND gate 21 having the chip clock input thereto. The output of NAND gate 21 is input to AND gate 23, which AND gate 23 has the chip clock applied to its other input. The output of the AND gate 23 is connected to the data input of a D flip-flop 25. The system clock is connected to the clock input of the flip-flop 25 via a fixed delay element 27. More specifically, the fixed delay element 27 has an input connected to the system clock input of NAND gate 19 and an output connected to the clock input of the flip-flop 25. The fixed delay element 27 provides a fixed amount of propagation delay between the input and output thereof, thus providing a delay between the system clock and the clock input of the flip-flop 25. Of course, the propagation delay of element 27 is not absolutely fixed because it does vary with process, voltage and temperature. However, the delay is fixed relative to the other propagation delays and setup times of the phase detector 11. An AND gate 28 has an input connected to the output of NAND gate 19 in order to provide load balancing.

Figure 3:
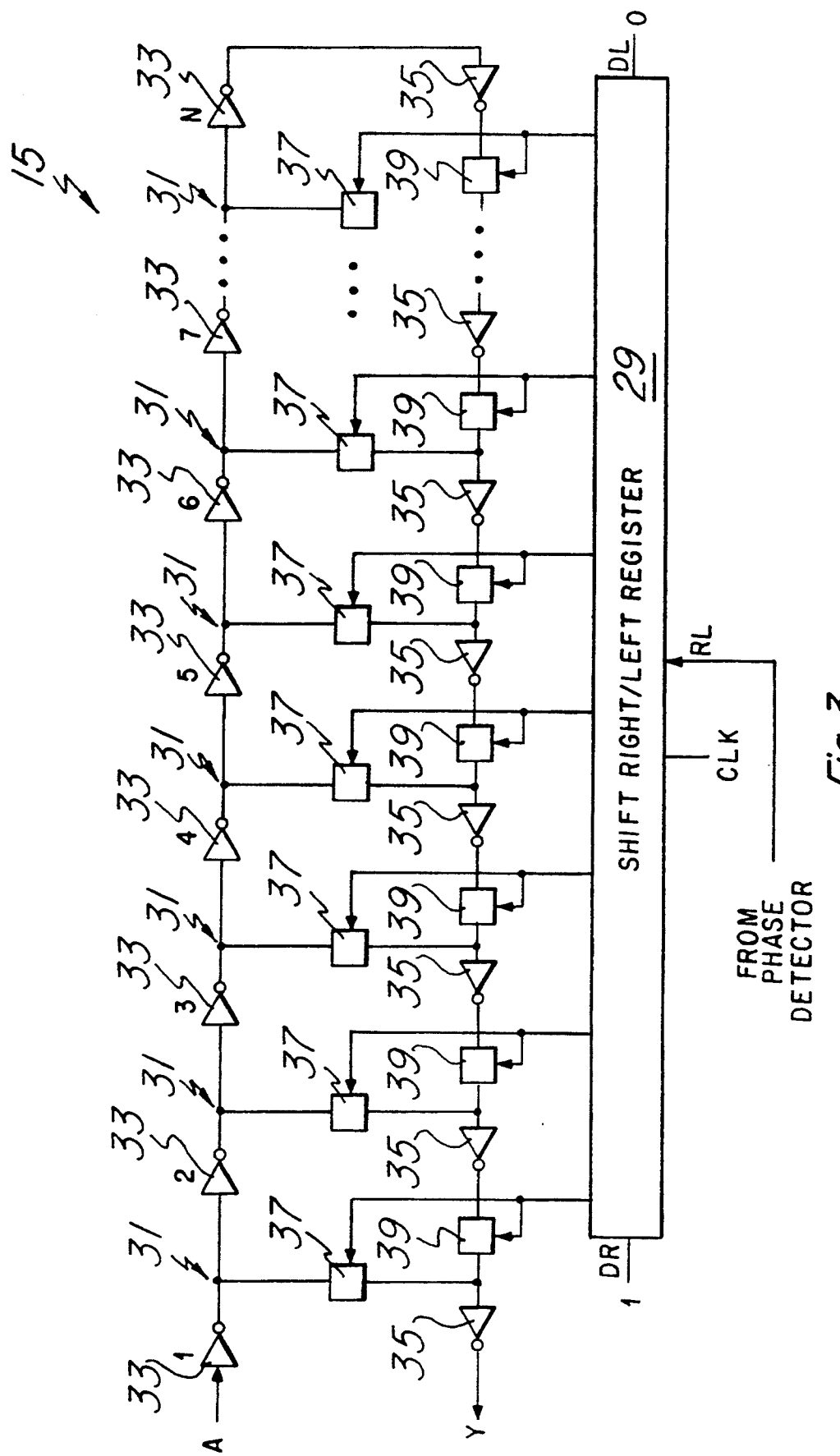
FIG. 3 is a circuit diagram of one embodiment of the digital delay line of FIG. 1.
Figure 3A:
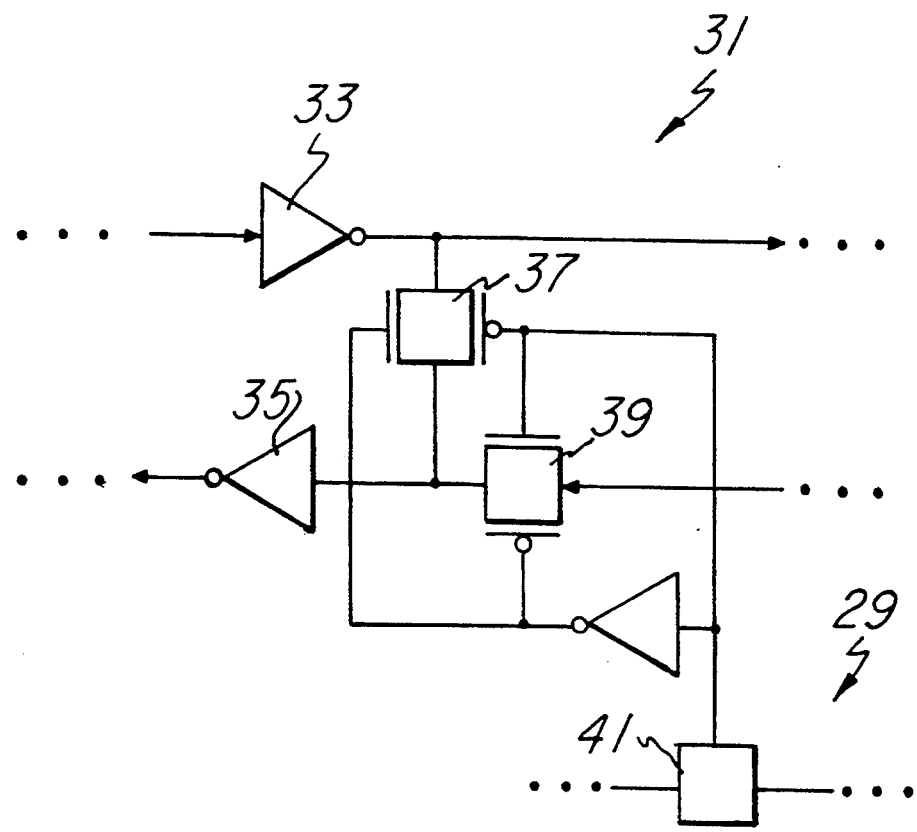
FIG. 3A is a circuit diagram of an individual delay unit of the delay line of FIG. 3.

Referring also to FIG. 3, the QZ output of flip-flop 25 is connected to the right/left (RL) shift control input of a serial bidirectional shift register 29 in the digital delay line 15. The digital delay line 15 also includes a plurality of individual delay units 31 which are cooperable to define a plurality of delay path sections for selective insertion into the delay path 13 to adjust the total delay amount provided by the delay path 13. As shown in FIGS. 3 and 3A, each delay element 31 includes a pair of inverters 33 and 35 which function as delay elements, and a pair of pass gates 37 and 39 which function as switching elements. Each inverter 33 and 35 provides a propagation delay between the input and output thereof, and each pass gate 37 and 39 functions as a switching element which is switchable into open and closed positions. The pass gate 37 is arranged between inverters 33 and 35 for permitting selective connection of the output of inverter 33 to the input of inverter 35, and the pass gate 39 is connected to the input of inverter 35 for permitting selective connection thereof to the next adjacent delay unit 31.

Referring to FIGS. 1 and 3, and particularly to the leftmost stage 1 delay unit 31 in FIG. 3, the input of stage 1 inverter 33 also defines the input A of delay line 15 and the output of stage 1 inverter 35 also defines the output Y of delay line 15. The remaining delay units 31 are arranged in a chain-like configuration as shown in FIG. 3. The individual stages of the chain-like configuration are connected as shown in FIG. 3. The output of stage 1 inverter 33 is connected to the input of stage 2 inverter 33, and the output of stage 2 inverter 35 is connected to the stage 1 pass gate 39 so as to be selectively connectable to the input of stage 1 inverter 35. Each of the remaining stages is connected to the immediately preceding stage in the same manner that stage 2 is connected to stage 1.

The bidirectional shift register 29 functions as a delay adjustment circuit responsive to the phase detector for operating the pass gates 37 and 39 as switching elements to selectively insert the various possible delay path sections into the delay path 3 of FIG. 1. For example, by enabling stage 1 pass gate 37 and disabling all pass gates 39, a delay section defined by stage 1 inverter 33, stage 1 pass gate 37 and stage 1 inverter 35 is inserted into the delay path 13. As another example, by disabling stage 1 pass gate 37, enabling stage 1 pass gate 39, enabling stage 2 pass gate 37 and disabling the remaining pass gates 39, a delay section defined by stage 1 inverter 33, stage 2 inverter 33, stage 2 pass gate 37, stage 2 inverter 35, stage 1 pass gate 39 and stage 1 inverter 35 is inserted into the delay line 13.

Referencing FIG. 3A, the pass gates 37 and 39 of each delay unit 31 are enabled or disabled by a single register cell or bit 41 of the shift register 29. When the bit in register cell 41 is a 0, then pass gate 37 is enabled and pass gate 39 is disabled. When the bit in register cell 41 is a 1, then pass gate 37 is disabled and pass gate 39 is enabled. Thus, considering the pair of pass gates 37 and 39 associated with each individual delay unit 31, one pass gate is enabled and the other is disabled depending on whether the bit in register cell 41 is a 1 or a 0. It should also be noted that the pass gates 37 and 39 of each individual delay unit 31 will be enabled/disabled substantially simultaneously with one another because both pass gates 37 and 39 are controlled by a single bit of the shift register 29.

Referring again to FIG. 3, the data to be shifted rightwardly in shift register 29 is provided at the DR input, and the data to be shifted leftwardly is provided at the DL input. As shown in FIG. 3, the DR input is tied to a logic 1, and the DL input is tied to a logic 0. At system power up, all of the cells 41 of register 29 are cleared, so that all of the pass gates 37 are enabled and all of the pass gates 39 are disabled. Therefore, at power up, the delay section defined by stage 1 inverter 33, stage 1 pass gate 37 and stage 1 inverter 35 is in the delay path 13.

However, if logic 1's the thereafter shifted rightwardly through the shift register 29, then the pass gates 37 are sequentially disabled while the pass gates 39 sequentially enabled. Thus, if three 1sare shifted rightwardly into shift register 29 after power-up, then the following delay section will be inserted into delay path 13: Inverters 33 of stages 1-4, pass gate 37 of stage 4, inverters 35 of stages 1-4, and pass gates 39 of stages 1-3. The selected delay section can be identified by simply reading the contents of shift register 29 by any conventional means.

It should be evident that the delay provided by digital delay line 15 is increased by shifting additional logical 1's rightwardly through shift register 29 and is decreased by shifting logical 0's leftwardly through shift register 29. The smallest possible delay section which can be inserted into the delay path 13 is the section defined by stage 1 inverter 33, stage 1 pass gate 37 and stage 1 inverter 35. This minimum delay occurs when the shift register contains all 0's, such as at power up. With each additional 1 that is shifted rightwardly, an additional incremental delay amount is added into the delay path 13. The incremental delay amount is the sum of the propagation delays of two inverters and one pass gate, except for the Nth stage which adds the delay of two inverters only. For total uniformity, a "dummy" gate delay could be inserted between stage N inverters 33 and 35. The maximum possible delay occurs when the shift register contains all 1's, and the maximum possible delay is defined by the number N of stages in the delay line 15. The number N of stages can be as large as necessary to realize the required maximum delay. Moreover, the undesirable loading conditions imposed by prior art delay lines are avoided no matter how many stages are used.

Thus, the digital delay line 15 provides a wide range of delay adjustment, which helps compensate for wide variations in system components caused by changes in process, voltage and temperature. The wide range of delay adjustment also allows two chips to communicate with one another safely because large discrepancies in gate complexity/fanout between the two chips can be absorbed. It should also be noted that the aforementioned minimum delay provided by the digital delay line 15 is the same no matter how many stages are used in the chain. Thus, the only design criteria is that enough delay units 31 must be included to ensure adequate delay even under minimum delay conditions of process, voltage and temperature. It is therefore possible to construct the digital delay line 15 so that the maximum delay thereof under minimum delay conditions of process, voltage and temperature is significantly larger than the minimum delay thereof under maximum delay conditions of process, voltage and temperature. In other words, it is easy to design the digital delay line 15 to operate both at high frequencies and over a relatively wide range of frequencies compared to prior art delay lines.

Figure 3B:
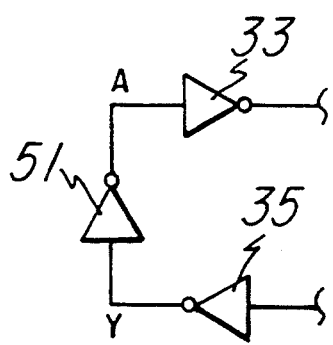
FIGS. 3B and 3C illustrate how the delay line of FIG. 3 can be configured as a ring oscillator.
Figure 3C:
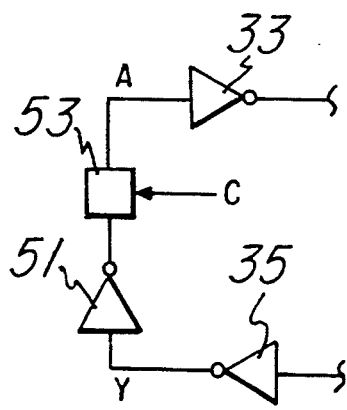

The digital delay line 15 described above can be configured as a ring oscillator by inserting an inverter 51 between output Y and input A, as shown in FIG. 3B. If a pass gate 53 is inserted between inverter 51 and input A as shown in FIG. 3C, then the resulting structure can be selectively configured as a ring oscillator or a delay line by respectively enabling or disabling the pass gate 53 via the control line C. Thus, the single circuit structure of FIG. 3C provides the user with two design options.

Referring again to FIG. 2, the QZ output of flip-flop 25 is connected to the right/left (RL) shift control input of the shift register 29 in FIG. 3. When the QZ output of flip-flop 25 is 1, then 1's are shifted rightwardly through the shift register 29 with each clock pulse, thereby increasing the delay provided by the digital delay line 15. On the other hand, when the QZ output is 0, then 0's are shifted leftwardly through the shift register 29, thereby decreasing the delay provided by the digital delay line 15.

The operation of the phase detector 11 will now be described with reference to FIGS. 2 and 4. At power up, the flip-flop 25 is cleared so that the QZ output is 1. Thus, the phase detector 11 initially causes the digital delay line 15 to begin increasing the amount of delay in the delay path 13. The delay will continue to increase until the QZ output changes to 0. However, the QZ output will be driven to a logic 0 only when a positive edge of the chip clock occurs within a specified time window after the occurrence of a positive edge of the system clock. This situation is indicated by chip clock 2 in FIG. 4. The width of the time window is determined by subtracting the propagation delay of AND gate 23 and the setup time of flip-flop 25 from the fixed delay amount of the fixed delay element 27. The window width must be larger than the incremental delay amount of the delay line 15, as will be explained in more detail below.

Figure 4:
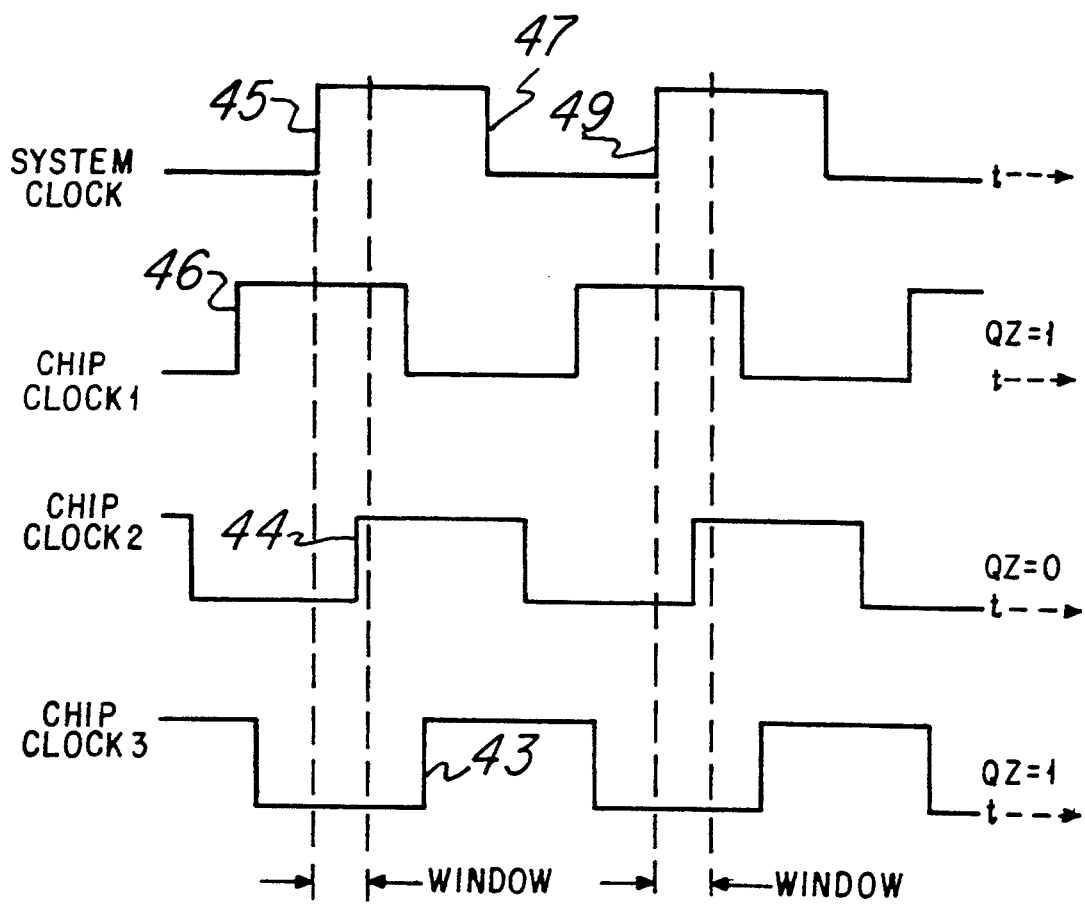
FIG. 4 is a timing diagram which illustrates the operation of the phase detector of FIG. 2.

Considering the case of chip clock 2 in FIG. 4, the output of both NAND gates 19 and 21 is initially high, because both the system clock and chip clock 2 are initially low. When the system clock goes high, the output of NAND gate 19 goes low, setting the output of NAND gate 21 high. When chip clock 2 goes high, it propagates through the AND gate 23 to the D input of the flip-flop 25. As long as chip clock 2 falls within the window of FIG. 4, then a 1 will be clocked through the flip-flop 25 so that a 0 is applied to the right/left shift control input of the shift register 29, thereby causing the digital delay line 15 to decrease the delay of delay path 13.

On the other hand, if a positive edge of the chip clock does not fall within the window of FIG. 4, then the phase detector 11 will output a 1 to the shift register 29, causing the delay to increase. Considering the case of chip clock 1 of FIG. 4, the outputs of NAND gates 19 and 21 are both initially high because both the system clock and chip clock 1 are initially low. When chip clock 1 goes high, the output of NAND gate 21 goes low, thereby driving the output of AND gate 23 low and placing a 0 at the D input of flip-flop 25. When the system clock goes high, the output of NAND gate 19 is held high due to the low output of NAND gate 21. Thus, when the system clock propagates through the fixed delay element 27 to the flip-flop 25, it clocks a 0 through flip-flop 25 and causes the delay line to continue increasing the delay (because QZ is 1). The pulse edge 46 of chip clock 1 will eventually step into the window, at which time the delay line 15 will decrease delay as discussed above with respect to chip clock 2. Pulse edge 46 of chip clock 1 can be guaranteed to step into the window but not completely through it by making the window width greater than the incremental delay amount of the delay line 15.

Referring now to FIGS. 2 and 4, the case of chip clock 3 will be described. It should be noted initially that the pulse edge 43 of chip clock 3 trails pulse edge 45 of the system clock by less than one-half cycle. The outputs of NAND gates 19 and 21 are initially high because both the system clock and chip clock 3 are initially low. When the system clock goes high, the output of NAND gate 19 goes low, latching the output of NAND gate 21 high and thereby enabling chip clock 3 to be applied to flip-flop 25 via AND gate 23. Note that edge 43 of chip clock 3 must trail edge 45 of the system clock by at least the minimum total delay of the delay path 13. Therefore, the fixed delay at 27 can be made less than the minimum total delay of the delay path 13, so that the flip-flop 25 will be clocked by edge 45 of the system clock before edge 43 of chip clock 3 occurs. Thus, a 0 is clocked through flip-flop 25, causing the delay line 15 to increase delay.

Eventually, edge 43 of chip clock 3 will be time-shifted past edge 47 of the system clock so that edge 43 occurs immediately after edge 47. When the system clock goes low at edge 47, the output on NAND gate 19 is driven high, while the output on NAND gate 21 remains high because chip clock 3 is still low. When chip clock 3 goes high at edge 43, NAND gate 21 is driven low because both of its inputs are high. The low output of NAND gate 21 drives the output of AND gate 23 low, thus setting up a low level at the input of flip-flop 25. Therefore, when the next positive edge 49 of the system clock occurs, the input of flip-flop 25 is low, thus keeping the QZ output high and causing the delay line 15 to continue increasing delay. Thereafter, the edge 43 of chip clock 3 will be eventually time-shifted past the edge 49 of the system clock. Because the incremental delay amount of the delay line 15 is less than the window width of FIG. 4, the edge 43 will step into the window relative to edge 49 of the system clock. Thereafter, the PLL will decrease delay as discussed above with respect to chip clock 2.

Thus, both chip clock 1 and chip clock 3 will eventually be delayed enough for the respective positive edges 46 and 43 to step into the time window of FIG. 4, and the PLL circuit 10 will thereafter decrease delay as discussed above with respect to chip clock 2. Once the positive edge 43, 44 or 46 of the chip clock is within the window, as illustrated by edge 44 of chip clock 2, the phase detector 11 directs the delay line 15 to decrease delay until the edge steps leftwardly back out of the window, at which time the phase detector 11 will direct the delay line 15 to increase delay. Thus, locking is achieved by causing the edge 44 to repeatedly step forwardly into and backwardly out of the window. In other words, at locking, the phase detector 11 controls the shift register 29 so that the data therein is repetitively shifted one position leftwardly and then one position rightwardly and so on.

Thus, the PLL circuit 10 always increases the delay of the delay path 13 until a positive edge of the chip clock steps into the window, and thereafter decreases the delay until the positive edge steps out of the window, and thereafter alternately increases and decreases the delay to lock the positive edge of the chip clock to the positive edge of the system clock.

Regarding the design of the fixed delay element 27, assume for purposes of example that: the incremental delay amount of delay line 15 is 200 ps under minimum delay conditions of process, voltage and temperature and 650 ps under maximum delay conditions; and the sum of the propagation delay of AND gate 23 and the setup time of flip-flop 25 is 700 ps under minimum delay conditions of process, voltage and temperature and 2200 ps under maximum delay conditions. Using the foregoing example parameters, it is acceptable to provide a fixed delay at 27 of 1100 ps under minimum delay conditions of process, voltage and temperature and 3600 ps under maximum delay conditions. The fixed delay 27 can be conveniently implemented using a series of gate delays.

As noted above, the fixed delay at 27 must also be less than the minimum total delay of the delay path 13. This minimum total delay includes the minimum delay of the delay line 15 and the minimum delay of any other delaying elements in the delay path 13, such as the clock distribution circuit 17 of FIG. 1. Therefore, the minimum delay of delay path 13 is a function of design complexity, and depends on the fanout/frequency requirements of the particular system in which the PLL 10 is to be used.

The digital PLL circuit 10 can easily be designed to operate at very high clock frequencies. Of course, the shift register 29 has a maximum clocking frequency which cannot be exceeded. However, the system clock is easily divided down to a clocking frequency which is acceptable for the shift register 29.

The phase detector 11 having cross-coupled NAND gates 19 and 21 can resolve phase differences of less than 80ps, which represents a significant improvement over prior art phase detectors which utilize only a D flip-flop.

Figure 5:
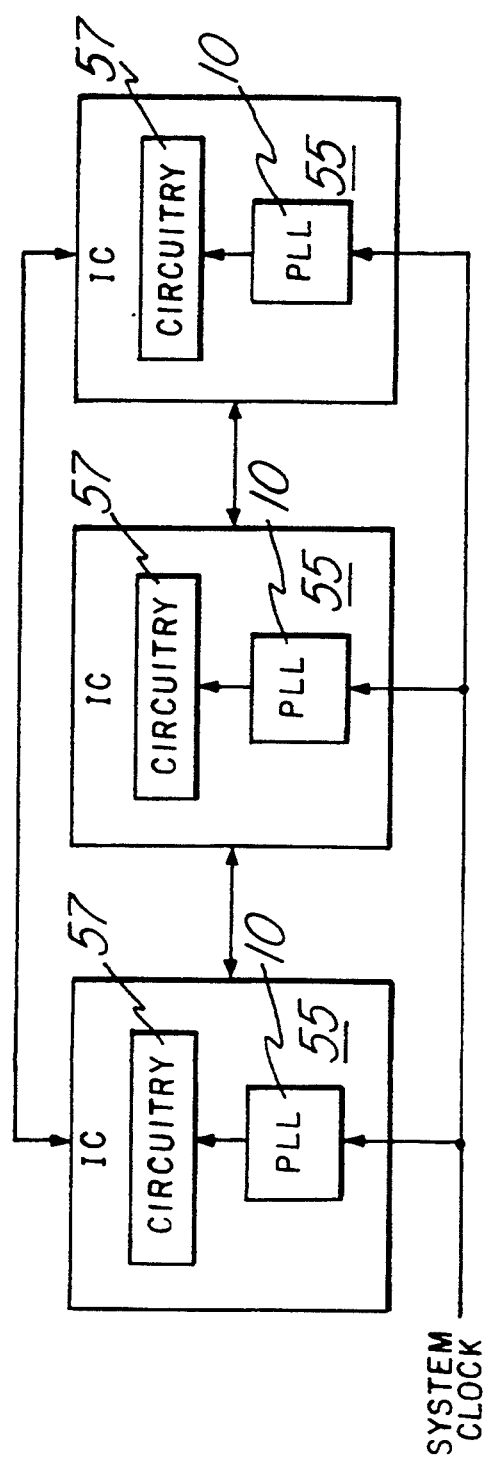
FIG. 5 is a block diagram showing the PLL circuit of FIG. 1 implemented in a multiple IC system.

FIG. 5 diagrammatically illustrates the use of PLL 10 in an electronic system having a plurality of interconnected ICs 55 which are all connected to a system clock. Each IC 55 is provided with a PLL 10 to synchronize the on-chip clock to the system clock. The on-chip clock is applied to the operational circuitry 57 of the IC 55.

Although exemplary embodiments of the invention have been described in detail, this description is not to be construed as limiting because the invention can be practiced in a variety of embodiments.

What is claimed is:

1. A phase locked loop circuit comprising:
   a phase detector for detecting a phase relationship between first and second clock signals which each have a series of alternately rising and falling pulse edges, said phase detector having inputs from said first and second clock signals to be applied thereto;
   means defining a delay path having an input for said first clock signal and having an output, said delay path providing an adjustable amount of propagation delay between said input and said output, said second clock signal being generated at said delay path output, said second clock signal being time-shifted relative to said first clock signal due to the delay provided by said delay path, said delay path being connected to said phase detector to receive therefrom control signals based on said detected phase relationship, and said delay path being responsive to said control signals to adjust said delay amount;
   said phase detector including a control circuit which, at a point in time when an edge of said second clock signal trails a corresponding edge of said first clock signal by less than one-half cycle, outputs a first said control signal which causes said delay path to increase said delay amount until said edge of said second clock signal is eventually time-shifted past the next successive corresponding edge of said first clock signal;

said control circuit operative, whenever an edge of said second clock signal trails a corresponding edge of said first clock signal by less than a predetermined amount of time, to output a second said control signal which causes said delay path to decrease said delay amount;

said control circuit including a pair of cross-coupled NAND gates, one of said cross-coupled NAND gates having an input for said first clock signal, the other of said cross-coupled NAND gates having an input for said second clock signal, and a D flip-flop which is coupled to both of said NAND gate inputs;

said control circuit further including an AND gate having one input connected to an output of said other cross-coupled NAND gate and having another input connected to said input of said other NAND gate, said AND gate having an output which is connected to a data input of said D flip-flop, a fixed delay element which has an input and an output and which provides a fixed amount of propagation delay between said input and said output, said input of said fixed delay element being connected to said input of said on NAND gate, said output of said fixed delay element being connected to a clock input of said D flip-flop, said AND gate having a propagation delay associated therewith, said data input of said D flip-flop having a set up time associated therewith, and said predetermined amount of time being defined by substracting both said AND gate propagation delay and said flip-flop set up time from said fixed delay amount; and wherein said delay path includes a digital delay line arranged therein for permitting selective adjustment of said adjustable delay amount, said digital delay line having a plurality of individual delay units, said delay units being cooperable to define a plurality of delay path sections which are selectively insertable into said delay path to adjust said delay amount of said delay path, each said delay unit including first and second delay elements, each said delay element having an input and an output, each said delay element providing a propagation delay between said input and said output thereof, a pair of first and second switching elements which are switchable into open and closed positions, said first switching element being arranged between said delay elements for permitting selective connection of said output of said first delay element to said input of said second delay element, and said second switching element being connected to said input of said second delay element for permitting selective connection of said second delay element input to another said delay unit.

2. A phase locked loop circuit according to claim 1, wherein said input of said first delay element of one of said delay units defines an input of said digital delay line, and said output of said second delay element of said one delay unit defines an output of said digital delay line, said delay units being arranged in a chain-like configuration, a further said delay unit having said first delay element input thereof connected to said first delay element output of said one delay unit, said further delay unit having said second delay element output thereof coupled to said second delay element input of said one delay unit by said second switching element of said one delay unit.

3. A phase locked loop circuit according to claim 2, wherein said digital delay line includes a delay adjustment circuit connected between said phase detector and said switching elements for operating said switching elements to selectively insert said delay path sections into said delay path, said delay adjustment circuit being operative to always maintain each said pair of switching elements in respectively opposite operating positions, and said delay adjustment circuit being responsive to said control signals for sequentially selecting a plurality of said delay units and reversing the operating positions of the switching element pairs thereof substantially simultaneously with the sequential selection of the associated delay unit.

4. A phase locked loop circuit according to claim 3, wherein said delay elements are inverters, and wherein said delay adjustment circuit includes a serial bidirectional shift register having a plurality of bits, each said bit being connected to both said switching elements of each respective switching element pair, one said switching element of each said pair being closed when the associated bit is cleared and open when the associated bit is set, the other said switching element of each said pair being closed when the associated bit is set and open when the associated bit is cleared, said shift register having a control input for controlling whether data is shifted leftwardly or rightwardly therein, said D flip-flop of said phase detector having an output on which said central signals are provided, said flip-flop output being coupled to said control input of said shift register to provide said control signals to said shift register, said shift register having a first data input for data that is to be shifted rightwardly and having a second data input for data that is to be shifted leftwardly, one of said data inputs being held cleared, and the other of said data inputs being held set.

5. A digital delay line for selectively inserting an adjustable amount of propagation delay into a signal path, comprising:

a plurality of individual delay units, said delay units being cooperable to define a plurality of delay path sections which are selectively insertable into the signal path;

each said delay unit including first and second delay elements, each said delay element having an input and an output, each said delay element providing a propagation delay between said input and said output thereof; and said delay unit also including a pair of first and second switching elements which are switchable into open and closed positions, said first switching element being arranged between said delay elements for permitting selective connection of said output of said first delay element to said input of said second delay element, and said second switching element being connected to said input of said second delay element for permitting selective connection of said second delay element input to another said delay unit.

6. A digital delay line according to claim 5, wherein said input of said first delay element of one of said delay units defines an input of said digital delay line, and said output of said second delay element of said one delay unit defines an output of said digital delay line, said delay units being arranged in a chain-like configuration, a further said delay unit having said first delay element input thereof connected to said first delay element output of said one delay unit, said further delay unit having said second delay element output thereof coupled to said second delay element input of said one delay unit by said second switching element of said one delay unit.

7. A digital delay line according to claim 6, wherein said digital delay line includes a delay adjustment circuit connected to said switching elements for operating said switching elements to selectively insert said delay path sections into said signal path, said delay adjustment circuit being operative to always maintain each said pair of switching elements in respectively opposite operating positions, and said delay adjustment circuit being operative to sequentially select a plurality of said delay units and reverse the operating positions of the switching element pairs thereof substantially simultaneously with the sequential selection of the associated delay unit.

8. A digital delay line according to claim 7, wherein said delay elements are inverters, and wherein said delay adjustment circuit includes a serial bidirectional shift register having a plurality of bits, each said bit being connected to both said switching elements of each respective switching element pair, one said switching element of each said pair being closed when the associated bit is cleared and open when the associated bit is set, the other said switching element of each said pair being closed when the associated bit is set and open when the associated bit is cleared, said shift register having a control input for controlling whether data is shifted leftwardly or rightwardly therein, said shift register having a first data input for data that is to be shifted rightwardly and having a second data input for data that is to be shifted leftwardly, one of said data inputs being held cleared, and the other of said data inputs being held set.

9. A digital delay line according to claim 5, wherein said delay elements are inverters and said delay units are arranged in a chain-like configuration, one said delay unit having said first inverter input thereof connected to said first inverter output of another said delay unit, said one delay unit having said second inverter output thereof coupled to said second inverter input of said another delay unit by said second switching element of said another delay unit, said first inverter input and said second inverter output of said another delay unit having a further inverter arranged in series therebetween for configuring said digital delay line as a ring oscillator into which said delay path sections are selectively insertable.

10. A digital delay line according to claim 9, including a switching element arranged in series with said further inverter between said first inverter input and said second inverter output of said another delay unit for permitting said further inverter to be selectively inserted into and removed from electrical series connection between said first inverter input and said second inverter output of said another delay unit.

11. An electronic system, comprising:
a plurality of interconnected integrated circuit chips, all of said integrated circuit chips being connected to a single system clock signal which has a series of alternately rising and falling pulse edges;
each said integrated circuit chip having a phase locked loop circuit, said phase locked loop circuit including means defining a delay path having an input for said system clock signal and having an output, said delay path providing an adjustable amount of propagation delay between said input and said output, said delay path providing at said output thereof a chip clock signal which has a series of alternately rising and falling pulse edges and which drives operational circuitry on said integrated circuit chip, said chip clock signal being time-shifted relative to said system clock signal due to the delay provided by said delay path;
said phase locked loop circuit also including a phase detector for detecting a phase relationship between said system clock signal and said chip clock signal, said phase detector having inputs for said system clock signal and said chip clock signal to be applied thereto;
said delay path being connected to said phase detector to receive therefrom control signals based on said detected phase relationship, and said delay path being responsive to said control signals to adjust said delay amount; and
said phase detector including a control circuit which, at a point in time when an edge of said chip clock signal trails a corresponding edge of said system clock signal by less than one-half cycle, outputs a first said control signal which causes said delay path to increase said delay amount until said edge of said chip clock signal is eventually time-shifted past the next successive corresponding edge of said system clock signal.

* * * * *